(12) United States Patent
Lin

(10) Patent No.: US 11,961,584 B2
(45) Date of Patent: Apr. 16, 2024

(54) READOUT INTEGRATED CIRCUIT AND OPERATION METHOD THEREOF

(71) Applicant: Novatek Microelectronics Corp., Hsinchu (TW)

(72) Inventor: Wu Wei Lin, Taoyuan (TW)

(73) Assignee: Novatek Microelectronics Corp., Hsinchu (TW)

( * ) Notice: Subject to any disclaimer, the term of this patent is extended or adjusted under 35 U.S.C. 154(b) by 126 days.

(21) Appl. No.: 17/859,010

(22) Filed: Jul. 7, 2022

(65) Prior Publication Data

US 2024/0013817 A1 Jan. 11, 2024

(51) Int. Cl.
*G11C 7/00* (2006.01)
*G11C 7/10* (2006.01)
*G11C 7/14* (2006.01)

(52) U.S. Cl.
CPC .......... *G11C 7/1069* (2013.01); *G11C 7/1006* (2013.01); *G11C 7/1039* (2013.01); *G11C 7/14* (2013.01)

(58) Field of Classification Search
CPC ... G11C 7/1051; G11C 11/34; G11C 11/4093; G11C 19/00; G11C 2029/4402; G11C 27/02; G11C 5/02; G11C 5/04; G11C 5/063; G11C 7/06; G11C 7/10; G11C 7/1006; G11C 7/1033; G11C 7/1072; G11C 7/1078; G11C 7/22
See application file for complete search history.

(56) References Cited

U.S. PATENT DOCUMENTS

| 9,941,316 | B2* | 4/2018 | Sargent | H04N 25/62 |
| 11,635,853 | B2 | 4/2023 | Chen et al. | |
| 2007/0230827 | A1 | 10/2007 | Jaukijarvi et al. | |
| 2021/0373738 | A1 | 12/2021 | Chen et al. | |
| 2023/0229263 | A1 | 7/2023 | Chen et al. | |

FOREIGN PATENT DOCUMENTS

| CN | 101408934 | 1/2011 |
| CN | 105608437 | 5/2016 |
| CN | 103870817 | 4/2019 |
| TW | 202147085 | 12/2021 |

OTHER PUBLICATIONS

"Office Action of Taiwan Counterpart Application", dated Sep. 13, 2023, p. 1-p. 6.

* cited by examiner

*Primary Examiner* — Thong Q Le
(74) *Attorney, Agent, or Firm* — JCIPRNET

(57) ABSTRACT

The present invention provides a readout integrated circuit and an operation method thereof. The readout integrated circuit includes a readout circuit, a line buffer and a communication interface circuit. The readout circuit reads out a plurality of row sensing results of a plurality of sensor rows of a sensor. The line buffer is coupled to the readout circuit for temporarily storing a current row sensing result of a current sensor row of the sensor. The communication interface circuit is coupled to the line buffer. After the current row sensing result of the current sensor row is temporarily stored into the line buffer, the communication interface circuit outputs the current row sensing result in real time to a host circuit.

20 Claims, 6 Drawing Sheets

READOUT INTEGRATED CIRCUIT AND OPERATION METHOD THEREOF

BACKGROUND

Technical Field

The disclosure relates to an integrated circuit, and in particular to a readout integrated circuit and an operation method thereof.

Description of Related Art

Based on different panel technologies, the fingerprint sensor can be embedded in the display panel, or overlaid on the display panel, or overlaid under the display panel. The sensing region of the fingerprint sensor may be the entire active display region of the display panel. The readout circuit can read out the sensing result of the fingerprint sensor and store the sensing result temporarily in full memory. According to an embodiment in which the fingerprint sensor is not partitioned, the memory space of the full memory needs to be sufficient to accommodate the sensing results of one complete frame of the fingerprint sensor. After waiting for the sensing result of a complete frame is stored in the full memory, the readout circuit allows the host circuit (e.g., an application processor) to obtain the sensing result of a complete frame from the full memory. The host circuit needs to wait before the sensing result of the last row of a current frame is stored in full memory (the host circuit cannot obtain the sensing result of any row of the current frame of the fingerprint sensor).

According to an embodiment in which the fingerprint sensor is divided into multiple zones, the memory space of the full memory needs to be sufficient to accommodate the sensing results of one complete zone of the fingerprint sensor. In general, a zone has a large number of rows. The readout circuit scans the multiple zones of the fingerprint sensor, and the readout circuit stores the sensing results of all rows of the current zone in the full memory. After waiting for the sensing result of a complete zone is stored in the full memory, the readout circuit allows the host circuit to obtain the sensing result of a complete zone from the full memory. The host circuit needs to wait before the sensing result of the last row of a current zone is stored in full memory (the host circuit cannot obtain the sensing result of any row of the current zone of the fingerprint sensor).

It should be noted that the content of the "Description of Related Art" paragraph is used to help understand the disclosure. Some (or all) of the content disclosed in the "Description of Related Art" paragraph may not be known by those of ordinary skill in the art. The content disclosed in the "Description of Related Art" paragraph does not imply that the content was known to those with ordinary knowledge in the art before the disclosure is filed.

SUMMARY

The disclosure provides a readout integrated circuit and an operation method thereof to output a sensing result of a current sensor row in real time to a host circuit after the sensing result of the current sensor row is temporarily stored into a line buffer.

In an embodiment of the disclosure, the readout integrated circuit includes a readout circuit, a line buffer, and a communication interface circuit. The readout circuit is configured to read out multiple row sensing results of multiple sensor rows of a sensor. The line buffer is coupled to the readout circuit to temporarily store a current row sensing result of the current sensor row of the sensor. The communication interface circuit is coupled to the line buffer. After the current row sensing result of the current sensor row is temporarily stored into the line buffer, the communication interface circuit outputs the current row sensing result in real time to the host circuit.

In an embodiment of the disclosure, the operation method includes the following. Multiple row sensing results of multiple sensor rows of a sensor are read out by a readout circuit of a readout integrated circuit. A current row sensing result of a current sensor row of the sensor is temporarily stored by a line buffer of the readout integrated circuit. The current row sensing result is outputted in real time to a host circuit by a communication interface circuit of the readout integrated circuit after the current row sensing result of the current sensor row is temporarily stored into the line buffer.

Based on the above, the readout circuit can read out the current row sensing result of the current sensor row of the sensor, and temporarily store the current row sensing result into the line buffer. After the sensing result of the current sensor row is temporarily stored into the line buffer, the readout circuit can continue to read out sensing results of other sensor rows of the sensor, and the communication interface circuit can output the sensing result of the current sensor row in real time to the host circuit to free up memory space in the line buffer. Therefore, the host circuit can obtain the sensing result of the current row of a current region (or current frame) of a fingerprint sensor in real time before the sensing result of a last row of the current region (or current frame) is read out by the readout circuit.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
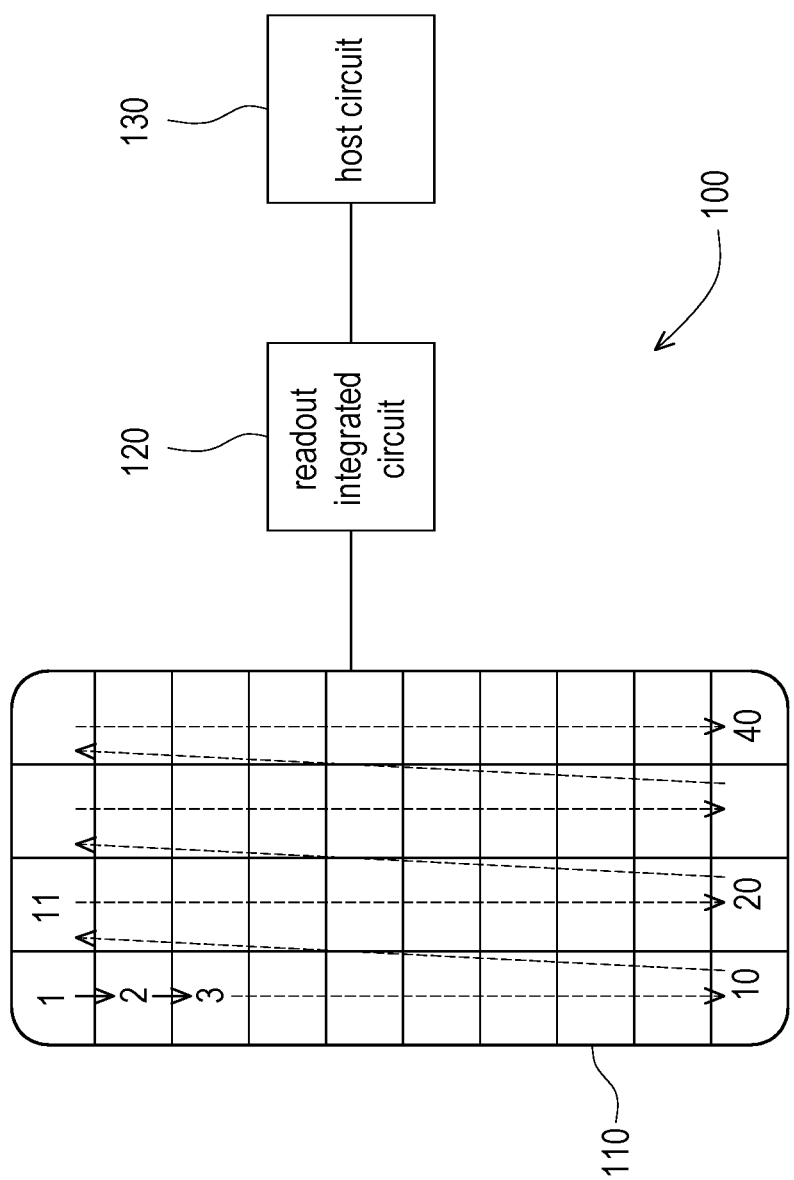
FIG. 1 is a schematic diagram of circuit block of a sensing device according to an embodiment of the disclosure.

The term "coupled (or connected)" as used throughout this specification (including the claims) may refer to any direct or indirect means of connection. For example, if the text describes the first device as coupled (or connected) to the second device, it should be interpreted as meaning that the first device may be directly connected to the second device or that the first device may be indirectly connected to the second device by some other device or some means of connection. Terms such as "first" and "second" mentioned in the full text of this specification (including the claims) are used to name elements or to distinguish different embodiments or ranges, and are not used to limit the upper or lower limit of the number of elements, nor are they used to limit the order of the elements. In addition, wherever possible, elements/components/steps using the same reference numerals in the drawings and embodiments represent the same or similar parts. Elements/components/steps that use the same reference numerals or use the same terms in different embodiments can refer to each other in the relevant descriptions.

FIG. 1 is a schematic diagram of circuit block of a sensing device 100 according to an embodiment of the disclosure. According to the actual design, the sensing device 100 can be a smart phone, a tablet, an access control device or other sensing devices. The sensing device 100 includes a sensor 110, a readout integrated circuit 120, and a host circuit 130. According to the actual design, the sensor 110 may be a fingerprint sensor and/or other sensors. According to some embodiments, the sensor 110 may be embedded in a display panel (not shown), or overlaid on the display panel, or overlaid under the display panel. According to some embodiments, a sensing region of the sensor 110 may be the entire active display region of the display panel. According to other embodiments, the sensing region of the sensor 110 may be a part of the active display region of the display panel. The sensor 110 may sense a user, for example, by sensing the user's fingerprint.

The sensor 110 may be divided into one or more scan zones. A number of the scan zones of the sensor 110 may be determined according to the actual design. For example, according to the embodiment shown in FIG. 1, the sensor 110 may be divided into 40 scan zones. According to other embodiments, the number of the scan zones of the sensor 110 may be greater than 40. According to still other embodiments, the number of the scan zones of the sensor 110 may be less than 40 (or even, the sensor 110 has only a single scan zone). The readout integrated circuit 120 may scan the multiple scan zones of the fingerprint sensor. Numbers in the scan zone (small squares) shown in FIG. 1 indicate scan order. In general, a scan zone has a large number of sensor rows. The readout integrated circuit 120 may read out multiple row sensing results of multiple sensor rows of each of the scan zones of the sensor 110 in a time-division manner, and provide the sensing results to the host circuit 130. It should be noted that after the readout integrated circuit 120 reads out a sensing result of a current sensor row in a current scan zone of the sensor 110, the readout integrated circuit 120 may continue to read out sensing results of other sensor rows in the current scan zone of the sensor 110, and the readout integrated circuit 120 may output the sensing result of the current sensor row in real time to the host circuit 130. Therefore, before a sensing result of a last row of the current scan zone is read out by the readout integrated circuit 120, the host circuit 130 may obtain the sensing result of the current row of the current scan zone in real time.

Figure 2:
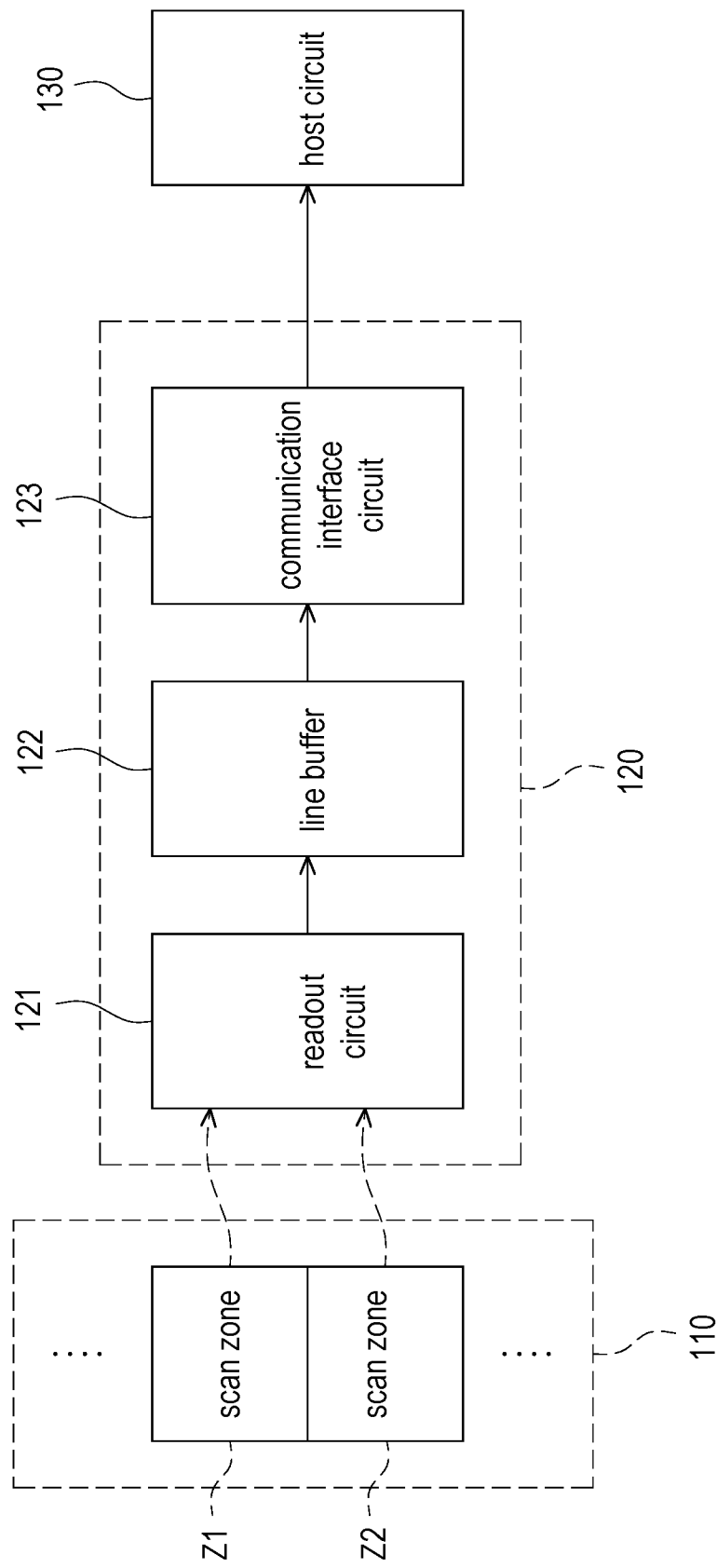
FIG. 2 is a schematic diagram of circuit block of a readout integrated circuit according to an embodiment of the disclosure.

FIG. 2 is a schematic diagram of circuit block of a readout integrated circuit 120 according to an embodiment of the disclosure. The readout integrated circuit 120 shown in FIG. 2 includes a readout circuit 121, a line buffer 122, and a communication interface circuit 123. Depending on the design requirements, the readout circuit 121 and/or the communication interface circuit 123 may be implemented as hardware, firmware, software, or a combination of more than one of the three.

In terms of hardware, the readout circuit 121 and/or the communication interface circuit 123 may be implemented as a logic circuit on an integrated circuit. Functions related to the readout circuit 121 and/or the communication interface circuit 123 may be implemented for hardware in hardware description languages (e.g., Verilog HDL or VHDL) or other suitable programming languages. For example, functions related to the readout circuit 121 and/or the communication interface circuit 123 may be implemented in one or more controllers, microcontrollers, microprocessors, application-specific integrated circuits (ASIC), digital signal processor (DSP), field programmable gate array (FPGA) and/or various logic blocks, modules, and circuits in other processing units.

In terms of software and/or firmware, functions related to the readout circuit 121 and/or the communication interface circuit 123 may be implemented as programming codes. For example, the readout circuit 121 and/or the communication interface circuit 123 are implemented using general programming languages (e.g., C, C++, or assembly language) or other suitable programming languages. The programming codes may be recorded/stored in a "non-transitory readable medium". According to some embodiments, the non-transitory readable medium includes, for example, read only memory (ROM), semiconductor memory, programmable logic circuits, and/or storage devices. A central processing unit (CPU), controller, microcontroller or microprocessor can read and execute the programming codes from the non-transitory readable medium, thereby implementing the functions related to the readout circuit 121 and/or the communication interface circuit 123.

The readout circuit 121 may read out the multiple row sensing results of the multiple sensor rows of the sensor 110. For example, the readout circuit 121 may read out the multiple row sensing results of the multiple sensor rows of the each of the scan zones (e.g., scan zones Z1 and Z2) of the sensor 110 in a time-division manner, and store the multiple row sensing results of different sensor rows in the line buffer 122 at different times. A maximum number of rows of the row sensing results that can be stored in the memory space of the line buffer 122 may be less than a total number of rows of the sensor rows in one scan zone. For example (but not limited to), one scan zone may have 100 sensor rows, while the line buffer 122 stores the sensing results of up to two sensor rows.

Figure 3:
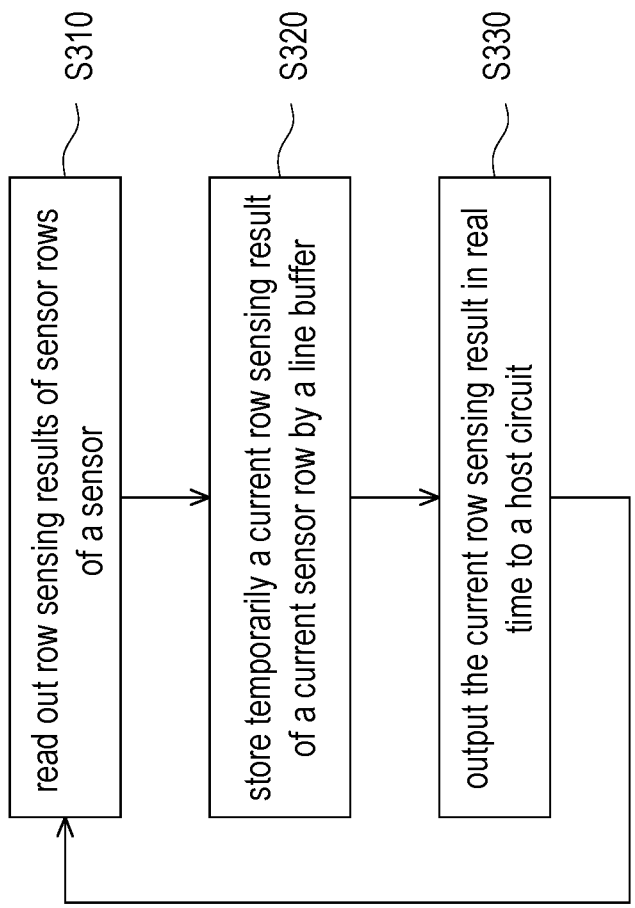
FIG. 3 is a schematic flowchart of an operation method of a readout integrated circuit according to an embodiment of the disclosure.

FIG. 3 is a schematic flowchart of an operation method of a readout integrated circuit according to an embodiment of the disclosure. Referring to FIG. 2 and FIG. 3, in step S310, the readout circuit 121 may read out the multiple row sensing results of the multiple sensor rows in the current scan zone of the sensor in a time-division manner. The line buffer 122 is coupled to the readout circuit 121. In step S320, the line buffer 122 may temporarily store the sensing result (a current row sensing result) of the current sensor row in the current scan zone of the sensor 110. The communication interface circuit 123 is coupled to the line buffer 122. After the sensing result of the current sensor row is temporarily stored into the line buffer 122, the communication interface circuit 123 may output the current row sensing result in real time to the host circuit 130 (step S330).

A communication interface between the communication interface circuit 123 and the host circuit 130 can be implemented according to the actual design. For example, according to some embodiments, the communication interface circuit 123 may include a Serial Peripheral Interface (SPI) circuit. The host circuit 130 may send an SPI read command to the communication interface circuit 123 to read the current row sensing result in the line buffer 122. When the communication interface circuit 123 outputs the current row sensing result to the host circuit 130, the readout circuit 121 may read out a sensing result (a next row sensing result) of a next sensor row of the sensor 110. That is, before the readout circuit 121 completely reads out the row sensing results of all sensor rows in the current scan zone, the communication interface circuit 123 may output the current row sensing result to the host circuit 130.

For example, when the readout circuit 121 temporarily stores the current row sensing result of the current sensor row of the sensor 110 in the line buffer 122, the communication interface circuit 123 may output a previous row sensing result in the line buffer 122 to the host circuit 130 to free up the memory space occupied by the previous row sensing result. When the readout circuit 121 temporarily stores the next row sensing result of the next sensor row of the sensor 110 to the line buffer 122, the communication interface circuit 123 may output the current row sensing result in the line buffer 122 to the host circuit to free up the memory space occupied by the current row sensing result.

Figure 4:
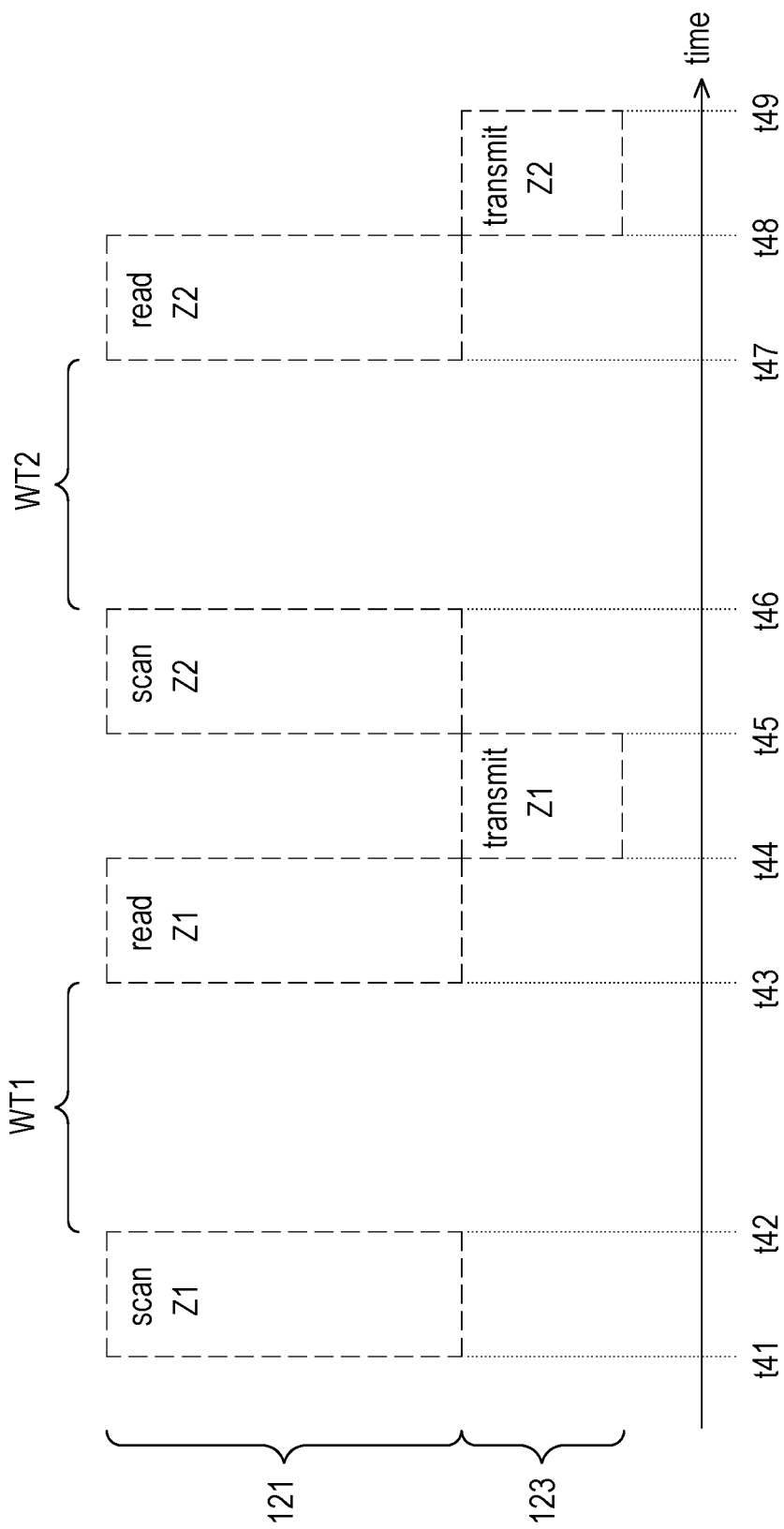
FIG. 4 is a schematic diagram illustrating operation timing of a readout circuit and a communication interface circuit according to an embodiment.

FIG. 4 is a schematic diagram illustrating operation timing of a readout circuit 121 and a communication interface circuit 123 according to an embodiment. The horizontal axis of FIG. 4 represents time. At time t41 to time t42, the readout circuit 121 scans all sensor rows in one scan zone of the sensor 110 (e.g., the scan zone Z1 shown in FIG. 2). After a waiting time WT1 (time t42 to time t43), the readout circuit 121 writes the row sensing results of all sensor rows in the scan zone Z1 into "full memory" in time t43 to time t44 (according to the embodiment shown in FIG. 4, the line buffer 122 shown in FIG. 2 is temporarily replaced by a full memory with a larger memory space). After all the row sensing results of the scan zone Z1 are written into "full memory", the communication interface circuit 123 transmits all the row sensing results of the scan zone Z1 to the host circuit 130 in time t44 to time t45. At time t45 to time t46, the readout circuit 121 scans all sensor rows in a next scan zone of the sensor 110 (e.g., the scan zone Z2 shown in FIG. 2). After a waiting time WT2 (time t46 to time t47), the readout circuit 121 writes the row sensing results of all sensor rows in the scan zone Z2 into "full memory" in time t47 to time t48. After all the row sensing results of the scan zone Z2 are written into "full memory", the communication interface circuit 123 transmits all the row sensing results of the scan zone Z2 to the host circuit 130 in time t48 to time t49.

Figure 5:
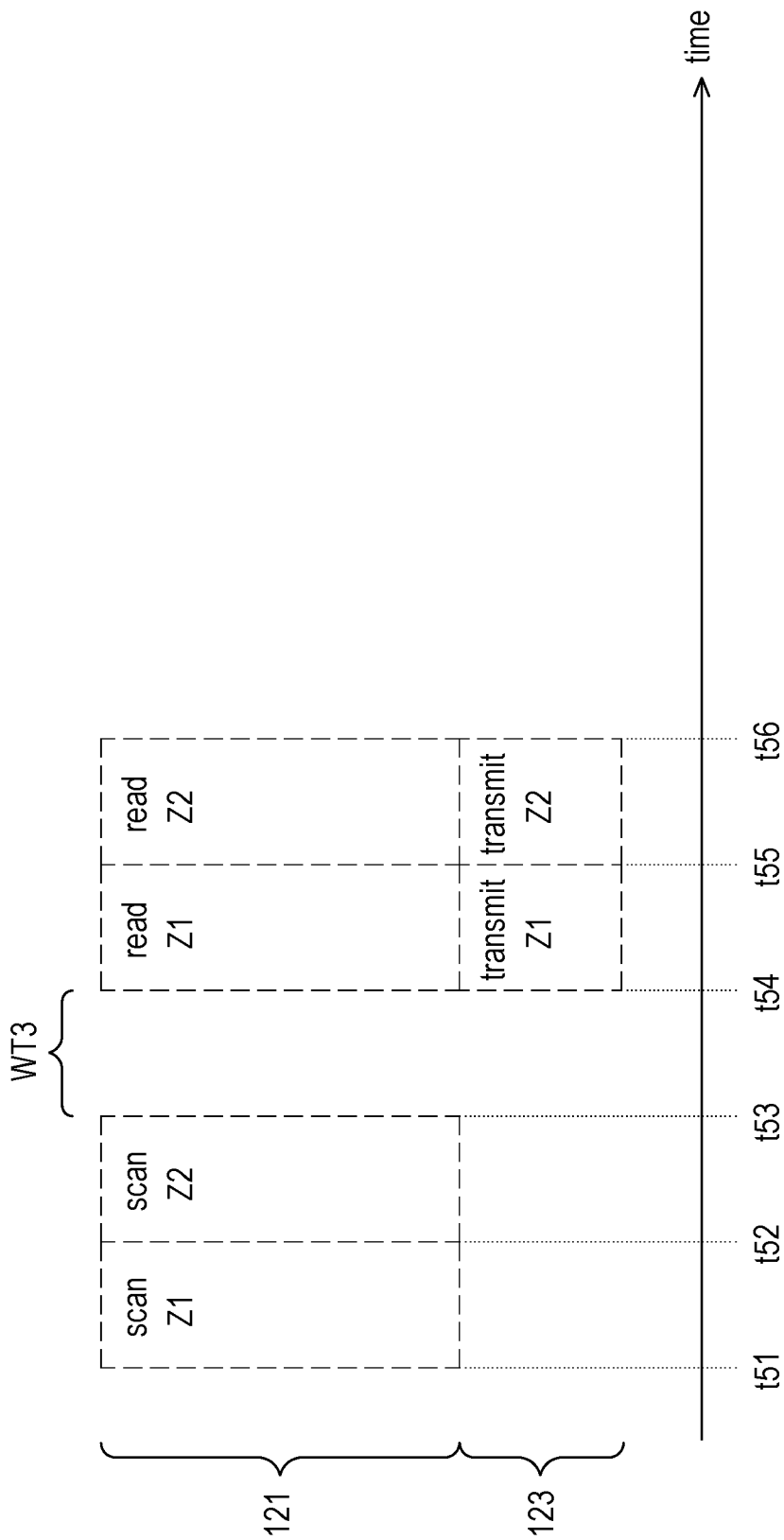
FIG. 5 is a schematic diagram illustrating operation timing of a readout circuit and a communication interface circuit according to an embodiment of the disclosure.

FIG. 5 is a schematic diagram illustrating operation timing of a readout circuit 121 and a communication interface circuit 123 according to an embodiment of the disclosure. The horizontal axis of FIG. 5 represents time. Compared to the embodiment shown in FIG. 4, according to the embodiment shown in FIG. 5, the line buffer 122 with a smaller memory space is used in place of the "full memory". Times t51, t52, t54, t55, and t56 shown in FIG. 5 may be analogized to the times t41, t42, t43, t44, and t45 shown in FIG. 4, respectively.

According to the embodiment shown in FIG. 5, the readout circuit 121 may scan all sensor rows in one scan zone of the sensor 110 (e.g., the scan zone Z1 shown in FIG. 2) in time t51 to time t52, and all sensor rows in the next scan zone of the sensor 110 (e.g. the scan zone Z2 shown in FIG. 2) in time t52 to time t53. After a waiting time WT3 (time t53 to time t54), the readout circuit 121 writes the row sensing results of all sensor rows in the scan zone Z1 into the line buffer 122 in a time-division manner in time t54 to time t55, and writes the row sensing results of all sensor rows in the scan zone Z2 into the line buffer 122 in a time-division manner in time t55 to time t56.

Compared with the embodiment shown in FIG. 4, according to the embodiment shown in FIG. 5, after the row sensing result (e.g., the current row sensing result) of any of the sensor rows is written into the line buffer 122, the communication interface circuit 123 may output the current row sensing result in the line buffer 122 in real time to the host circuit 130 to free up the memory space occupied by the current row sensing result. Thus, before the sensing result of the last row of the scan zone Z1 is written to the line buffer 122, the communication interface circuit 123 may transmit the multiple row sensing results of the scan zone Z1 to the host circuit 130 in time t54 to time t55. Similarly, before the sensing result of the last row of the scan zone Z2 is written to line buffer 122, the communication interface circuit 123 may transmit the multiple row sensing results of the scan zone Z2 to the host circuit 130 in time t55 to time t56.

Figure 6:
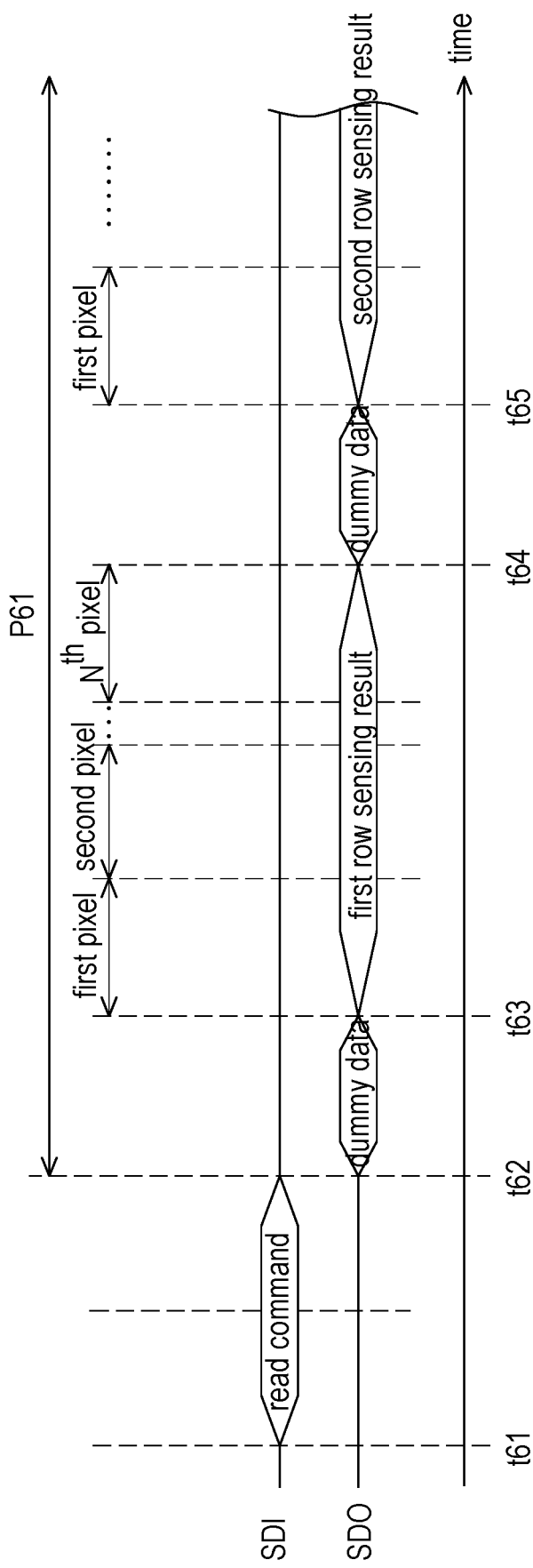
FIG. 6 is a schematic diagram illustrating operation timing between a communication interface circuit and a host circuit according to an embodiment of the disclosure.

FIG. 6 is a schematic diagram illustrating operation timing between a communication interface circuit 123 and a host circuit 130 according to an embodiment of the disclosure. The horizontal axis of FIG. 6 represents time. According to the embodiment shown in FIG. 6, a transmission interface between the communication interface circuit 123 and the host circuit 130 is assumed to be SPI. That is, the host circuit 130 may send commands and/or data to the communication interface circuit 123 through a serial data signal SDI, and the communication interface circuit 123 may output (return) the data to the host circuit 130 through a serial data signal SDO.

According to the embodiment shown in FIG. 6, the host circuit 130 may send a read command to the communication interface circuit 123 through the serial data signal SDI of the SPI in time t61 to time t62. After the host circuit 130 sends the read command to the communication interface circuit 123, the communication interface circuit 123 may return data to the host circuit 130 in an output period P61 corresponding to the read command. In detail, the communication interface circuit 123 may output a dummy data to the host circuit 130 in time t62 to time t63 to wait for the current row sensing result of the current sensor row (e.g., a first sensor row sensing result) without ending the output period P61. After the current row sensing result of the current sensor row is temporarily stored into the line buffer 122, the communication interface circuit 123 may end the output of the dummy data, and output the current row sensing result (e.g., the first row sensing result) to the host circuit 130 in real time in time t63 to time t64 of the output period P61. In general, the current row sensing result includes pixel sensing results of multiple pixels (e.g., a first pixel, a second pixel, . . . , a $N^{th}$ pixel).

After the first row sensing result is outputted to the host circuit 130, the communication interface circuit 123 may output a next dummy data to the host circuit 130 in time t64 to time t65 to wait for a second row sensing result of a second sensor row without ending the output period P61. After the second row sensing result of the second sensor row is temporarily stored into the line buffer 122, the communication interface circuit 123 may end the output of the dummy data, and output the second row sensing result in real time to the host circuit 130 in the output period P61. In this way, the communication interface circuit 123 may output the row sensing results of all sensor rows in one or more scan zones to the host circuit 130 in the output period P61, and then end the output period P61.

This embodiment does not limit the specific content of the read command and the dummy data. For example, in some practical applications, the read command may include "0x4000" (i.e., a hexadecimal value "4000"), and the dummy data includes a dummy value and a header. After the host circuit 130 sends the read command to the communication interface circuit 123, the communication interface circuit 123 may return the dummy value to the host circuit 130 in the output period P61 if the line buffer 122 is not ready for the current row sensing result. The dummy value may be any value determined according to the actual design, such as "0x55" or other agreed values. The host circuit 130 may ignore (discard) the dummy value and wait for the header to appear. When the line buffer 122 is ready with the current row sensing result, the communication interface circuit 123 may return the header to the host circuit 130 in the output period P61, and transmit the current row sensing result from the line buffer 122 to the host 130 after following the header. After the communication interface circuit 123 outputs the header to the host circuit 130, the communication interface circuit 123 ends the output of the dummy data but maintains the output period P61. The host circuit 130 may interpret the header to know the arrival of valid data (the current row sensing result). Information contained in the header may be set according to the actual design. For example, the header may contain position information of the sensor row corresponding to the currently output row sensing result.

This aforementioned embodiment does not limit the specific content of the header. For example, in some practical applications, the header includes a ready value and a row address (row address). The ready value may be any value determined according to the actual design, such as "0x5A" or other agreed values. The ready value may indicate that the readout integrated circuit 120 has prepared a row sensing result. The host circuit 130 may interpret the ready value in the header to know that the valid data (i.e., the current row sensing result) is coming. The row address may indicate which one of the multiple sensor rows in the current scan zone the current sensor row is. The host circuit 130 may interpret the row address in the header to know which one of the multiple sensor rows in the current scan zone the upcoming valid data (the current row sensing result) belongs to.

After the current row sensing result (e.g., the first row sensing result shown in FIG. 6) is completely outputted to the host circuit 130, the communication interface circuit 123 outputs another dummy data (a second dummy data) in time t64 to time t65 of the output period P61 of the read command to the host circuit 130 to wait for the next row sensing result of the next sensor row in the current scan zone of the sensor 110 (e.g., the second row sensing result shown in FIG. 6). After the second row sensing result (the next row sensing result) is temporarily stored into the line buffer 122, the communication interface circuit 123 may end the output of the second dummy data, and output the second row sensing result (the next row sensing result) to the host circuit 130 in real time in the output period P61 of the read command. By analogy, the readout circuit 121 writes a last row sensing result of a last sensor row in the current scan zone into the line buffer 122, and the communication interface circuit 123 transmits the last row sensing result of the current scan zone from the line buffer 122 to the host circuit 130. After the last row sensing result is transmitted to the host circuit 130, the communication interface circuit 123 may end the output period P61 of the read command.

To sum up, the readout circuit 121 according to the embodiments can read out the current row sensing result of the current sensor row of the sensor 110, and temporarily store the current row sensing result into the line buffer 122. After the sensing result of the current sensor row is temporarily stored into the line buffer 122, the readout circuit 121 can continue to read out sensing results of other sensor rows of the sensor, and the communication interface circuit 123 can transmit the sensing result of the current sensor row in real time from the line buffer 122 to the host circuit 130 to free up memory space in the line buffer 122. Therefore, the host circuit 130 can obtain the sensing result of the current row of a current region (or current frame) of a fingerprint sensor 110 in real time before the sensing result of a last row of the current region (or current frame) is read out by the readout circuit 121.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:
1. A readout integrated circuit, comprising:
a readout circuit, configured to read out a plurality of row sensing results of a plurality of sensor rows of a sensor;
a line buffer, coupled to the readout circuit, configured to temporarily store a current row sensing result of a current sensor row of the sensor; and
a communication interface circuit, coupled to the line buffer, wherein after the current row sensing result of the current sensor row is temporarily stored into the line buffer, the communication interface circuit outputs the current row sensing result in real time to a host circuit.

2. The readout integrated circuit of claim 1, wherein the readout circuit reads out the row sensing results of the sensor rows in a time-division manner.

3. The readout integrated circuit of claim 1, wherein the communication interface circuit comprises a Serial Peripheral Interface.

4. The readout integrated circuit of claim 1, wherein when the communication interface circuit outputs the current row sensing result to the host circuit, the readout circuit reads out a next row sensing result of a next sensor row of the sensor.

5. The readout integrated circuit of claim 1, wherein when the readout circuit temporarily stores a next row sensing result of a next sensor row of the sensor into the line buffer, the communication interface circuit outputs the current row sensing result to the host circuit.

6. The readout integrated circuit of claim 1, wherein before the readout circuit completely reads out the row sensing results of all sensor rows in a scan zone which the current sensor row belongs, the communication interface circuit outputs the current row sensing result to the host circuit.

7. The readout integrated circuit of claim 1, wherein,
after the host circuit sends a read command to the communication interface circuit through a Serial Peripheral Interface, the communication interface circuit outputs a first dummy data to the host circuit during a output period of the read command to wait for the current row sensing result of the current sensor row; and after the current row sensing result of the current sensor row is temporarily stored into the line buffer, the communication interface circuit ends the output of the first dummy data and immediately outputs the current row sensing result to the host circuit during the output period of the read command.

8. The readout integrated circuit of claim 7, wherein the first dummy data comprises a dummy value and a first header, and the communication interface circuit ends the output of the first dummy data after the first header is outputted to the host circuit, but keeps the output period.

9. The readout integrated circuit of claim 8, wherein the first header comprises a ready value and a first row address, the ready value indicates that the readout integrated circuit has prepared a row sensing result, and the first row address indicates which of the sensor rows the current sensor row is.

10. The readout integrated circuit of claim 7, wherein,
after the current row sensing result is completely outputted to the host circuit, the communication interface circuit outputs a second dummy data to the host circuit during the output period of the read command to wait for a next row sensing result of a next sensor row of the sensor; and
after the next row sensing result of the next sensor row is temporarily stored into the line buffer, the communication interface circuit ends the output of the second dummy data and immediately outputs the next row sensing result to the host circuit during the output period of the read command.

11. An operating method of a readout integrated circuit, comprising:
reading out a plurality of row sensing results of a plurality of sensor rows of a sensor by a readout circuit of the readout integrated circuit;
storing a current row sensing result of a current sensor row of the sensor by a line buffer of the readout temporarily integrated circuit; and
outputting the current row sensing result in real time to a host circuit by a communication interface circuit of the readout integrated circuit after the current row sensing result of the current sensor row is temporarily stored into the line buffer.

12. The operating method of claim 11, further comprising:
reading out the row sensing results of the sensor rows in a time-division manner by the readout circuit.

13. The operating method of claim 11, wherein the communication interface circuit comprises a Serial Peripheral Interface.

14. The operating method of claim 11, further comprising:
reading out a next row sensing result of a next sensor row of the sensor by the communication interface circuit when the current row sensing result is outputted to the host circuit.

15. The operating method of claim 11, further comprising:
outputting the current row sensing result to the host circuit by the communication interface circuit when a next row sensing result of a next sensor row of the sensor is temporarily stored into the line buffer.

16. The operating method of claim 11, further comprising:
outputting the current row sensing result to the host circuit by the communication interface circuit before completely reading out the row sensing results of all sensor rows in a scan zone which the current sensor row belongs.

17. The operating method of claim 11, further comprising:
outputting, by the communication interface circuit, a first dummy data to the host circuit during a output period of a read command after the host circuit sends the read command to the communication interface circuit through a Serial Peripheral Interface to wait for the current row sensing result of the current sensor row; and
ending the output of the first dummy data and immediately outputting the current row sensing result to the host circuit during the output period of the read command by the communication interface circuit after the current row sensing result of the current sensor row is temporarily stored into the line buffer.

18. The operating method of claim 17, wherein the first dummy data comprises a dummy value and a first header, and the operating method further comprises:
ending the output of the first dummy data by the communication interface circuit after the first header is outputted to the host circuit, but keeping the output period.

19. The operating method of claim 18, wherein the first header comprises a ready value and a first row address, the ready value indicates that the readout integrated circuit has prepared a row sensing result, and the first row address indicates which of the sensor rows the current sensor row is.

20. The operating method of claim 17, further comprising:
outputting, by the communication interface circuit, a second dummy data to the host circuit during the output period of the read command after the current row sensing result is completely outputted to the host circuit to wait for a next row sensing result of a next sensor row of the sensor; and
ending the output of the second dummy data and immediately outputting the next row sensing result to the host circuit during the output period of the read command by the communication interface circuit after the next row sensing result of the next sensor row is temporarily stored into the line buffer.

* * * * *